United States Patent
Ogura (10) Patent No.: US 6,229,740 B1
(45) Date of Patent: May 8, 2001

(54) VOLTAGE GENERATION CIRCUIT HAVING BOOST FUNCTION AND CAPABLE OF PREVENTING OUTPUT VOLTAGE FROM EXCEEDING PRESCRIBED VALUE, AND SEMICONDUCTOR MEMORY DEVICE PROVIDED THEREWITH

(75) Inventor: Taku Ogura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/466,481

(22) Filed: Dec. 17, 1999

(30) Foreign Application Priority Data

Jun. 25, 1999 (JP) ................................. 11-180126P (51) Int. Cl.[7] ........................................ G11C 7/00

(52) U.S. Cl. .................. 365/189.11; 365/185.18; 365/189.06; 365/194; 327/390; 327/589

(58) Field of Search ................. 365/189.11, 194, 365/189.06, 185.18, 185.01, 189.01; 327/390, 589

(56) References Cited

U.S. PATENT DOCUMENTS

| 4,581,672 | | 4/1986 | Lucero ................................. 361/18 |
| 5,436,552 | * | 7/1995 | Kajimoto ........................... 323/313 |
| 5,510,749 | * | 4/1996 | Arimoto .............................. 327/546 |
| 5,847,597 | * | 12/1998 | Ooishi et al. ...................... 327/543 |
| 5,903,498 | * | 5/1999 | Campardo et al. ............. 365/185.23 |

FOREIGN PATENT DOCUMENTS

| 56-118121 | 9/1981 | (JP) . |
| 8-149801 | 6/1996 | (JP) . |

* cited by examiner

Primary Examiner—David Nelms
Assistant Examiner—Hoai V. Ho
(74) Attorney, Agent, or Firm—McDermott, Will & Emery (57) ABSTRACT

A voltage generation circuit includes a boost circuit boosting a power supply voltage and transmitting the boosted voltage to an output transistor according to a boost control signal, a gate boost circuit boosting a gate voltage VHbst of the output transistor according to the boost control signal, a clamp circuit having a function of clamping VHbst to a prescribed voltage, and an output transistor receiving VHbst at its gate and provided to connect the boost circuit and a voltage supply node. The clamp circuit is activated according to the boost control signal.

11 Claims, 6 Drawing Sheets

| | WL | | SG | | WELL | | PAGE BUFFER |
|---|---|---|---|---|---|---|---|
| | SELECTED | NON-SELECTED | SELECTED | NON-SELECTED | SELECTED | NON-SELECTED | |
| WRITE | VNN | GND | VPP | GND | GND | GND | VPP |
| ERASE | VPP | GND | VNN | GND | VNN | GND | Vcc |
| READ | VWL | GND | VWL | GND | GND | GND | Vcc |

VOLTAGE GENERATION CIRCUIT HAVING BOOST FUNCTION AND CAPABLE OF PREVENTING OUTPUT VOLTAGE FROM EXCEEDING PRESCRIBED VALUE, AND SEMICONDUCTOR MEMORY DEVICE PROVIDED THEREWITH

BACKGROUND OF THE INVENTION

1. Field of the Invention

The present invention relates to voltage generation circuits having a boost function. More specifically, the present invention provides a configuration of a voltage generation circuit capable of preventing excessive boosting of an output voltage even if the circuit is used at wide-ranging power supply voltage levels and suppressing a standby current in a period other than a boosting operation period, and a configuration of a semiconductor memory device provided therewith.

2. Description of the Background Art

With active development of devices requiring lower power consumption such as portable devices, semiconductor products have operated at lower voltage.

In a semiconductor memory device performing electrical data reading, erasing, writing and the like such as a flash memory, electrical storage data stored in a memory cell is generally read to a data line such as a bit line by applying an "H" level voltage to a word line. In order to achieve both lower voltage operation and higher speed data reading operation, it is essential that the "H" level voltage applied when a word line is to be driven is a voltage obtained by boosting a power supply voltage.

A circuit for generating the boosted voltage is called a word line boost circuit and provided in a semiconductor memory device. It is necessary to design the word line boost circuit so as not to uselessly consume power by operating the circuit only during a period in which generation of a boosted voltage is necessary and inactivating the circuit during other periods such as a standby period.

Semiconductor products have various power supply voltage levels according to their specifications. For example, the current flash memory market has roughly three types of power supply voltage ranges, that is, the versions of Vcc= 1.6V~2.2V and Vcc=2.2V~2.7V which are regarded as lower power supply voltage versions, and the currently major version of Vcc=2.7V~3.6V.

In order to accommodate such various types of power supply voltage ranges, it is necessary to adjust boost capability according to a power supply voltage level in a word line boost circuit provided in a memory. Considering the case of the above described flash memory, it is necessary to switch boost capability according to power supply voltage range so that the boost capability is set to be larger for the Vcc=1.6V~2.2V version, smaller for the Vcc=2.2V~2.7V version, and boosting is not carried out for the Vcc= 2.7V~3.6V version.

Such a method is adopted for switching the boost capability that the capacitance value of a boost capacitor provided in a word line boost circuit is separately provided by changing a mask pattern in a semiconductor device manufacturing process.

When the boost capability is switched by mask pattern changes, however, it is disadvantageously required that different masks are prepared and undergone separate manufacturing processes according to the power supply voltage range of a flash memory.

Otherwise, a power supply voltage level is detected and the capacitance value of a boost capacitor is made variable according to the power supply voltage level as a method of switching the boost capability according to the value of a power supply voltage.

Figure 8:
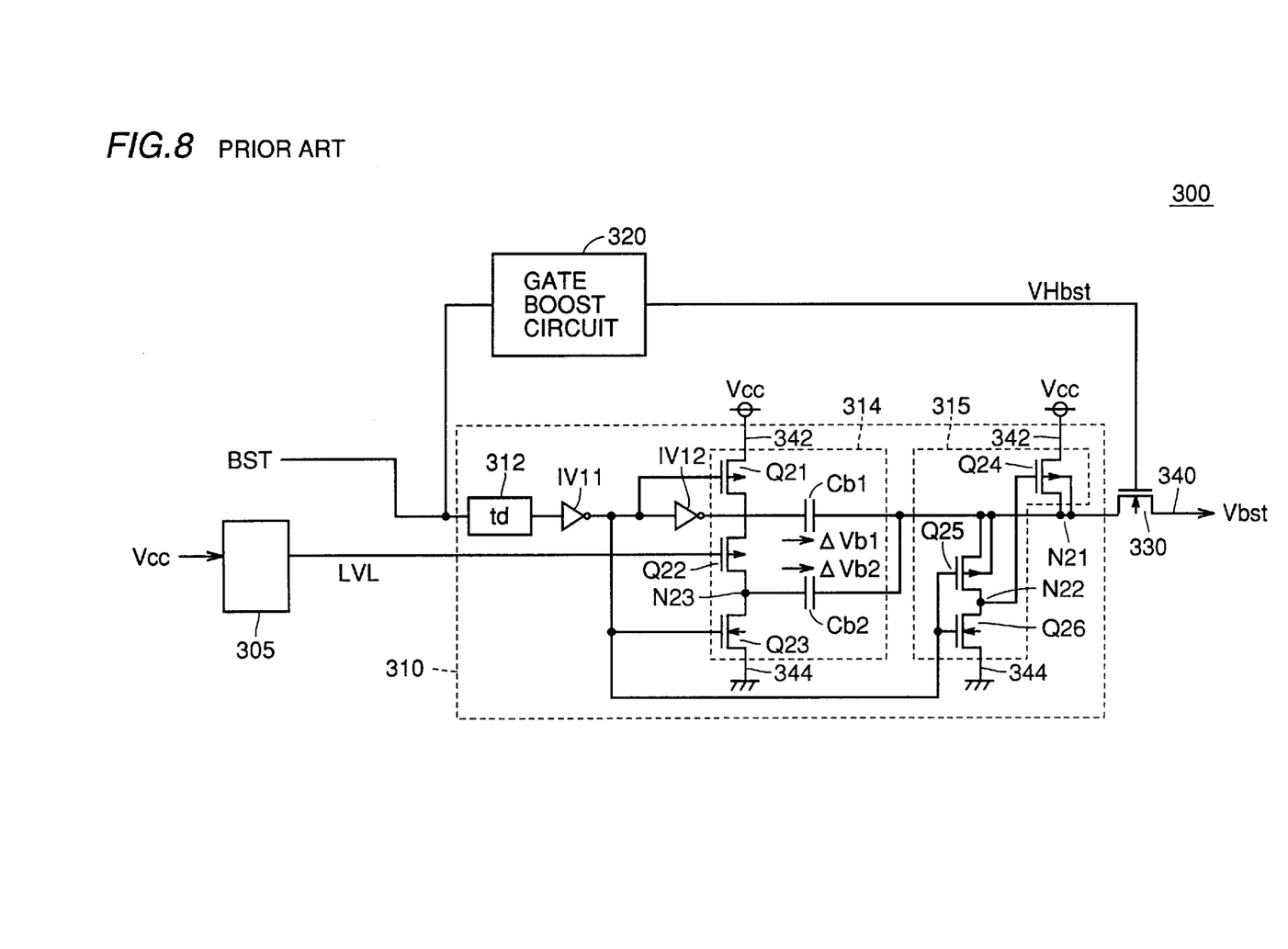
FIG. 8 is a circuit diagram showing a configuration of a conventional voltage generation circuit 300 used as a word line boost circuit.

FIG. 8 is a circuit diagram showing a configuration of a conventional voltage generation circuit 300 used as a word line boost circuit for generating a boosted voltage according to a power supply voltage level by adopting the above described method.

Referring to FIG. 8, voltage generation circuit 300 is a circuit for setting the voltage level Vbst of a voltage supply node 340 at one of a power supply voltage Vcc and a boosted voltage obtained by boosting Vcc. A boost control signal BST is activated to the "H" level when boosting is necessary and inactivated to the "L" level when boosting is not necessary.

Voltage generation circuit 300 includes a Vcc level detection circuit 305 receiving power supply voltage Vcc and setting a Vcc level signal LVL at the "H" level or the "L" level according to comparison between Vcc and a prescribed voltage, a boost circuit 310 transmitting one of power supply voltage Vcc and the boosted voltage to an output transistor 330 according to boost control signal BST and control signal LVL, a gate boost circuit 320 boosting the gate voltage of output transistor 330 according to boost control signal BST, and an output transistor 330 receiving an output of gate boost circuit 320 at its gate and provided to connect boost circuit 310 and voltage supply node 340.

Boost circuit 310 includes a delay circuit 312 receiving boost control signal BST, applying delay time td to boost control signal BST, and outputting delayed boosted control signal BST, a boost capacitance switch circuit 314 switching the capacitance value of a capacitor, which is used for boosting, according to the delayed boost control signal and Vcc level signal LVL, and a voltage switch circuit 315 transmitting one of power supply voltage Vcc and the boosted voltage as an output of boost capacitance switch circuit 314 to output transistor 330 according to delayed boost control signal BST.

Boost capacitance switch circuit 314 has P type MOS transistors Q21, Q22 and an N type MOS transistor Q23 connected in series between a power supply line 342 and a ground line 344. The gates of transistors Q21 and Q23 are supplied with delayed and inverted boost control signal BST which is an output of an inverter IV11. The gate of transistor Q22 is supplied with Vcc level signal LVL.

Boost capacitance switch circuit 314 also has a capacitor Cb1 connected between an internal node N21 and the output node of an inverter IV12, and a boost capacitor Cb2 connected between transistors Q22, Q23 and internal node N21.

Voltage switch circuit 315 has a P type MOS transistor Q24 having its gate connected to a node N22 and provided to connect power supply line 342 and internal node N21, and a P type MOS transistor Q25 and a N type MOS transistor Q26 connected in series between internal node N21 and ground line 344. The gates of transistors Q25 and Q26 are connected to the output node of inverter IV11.

According to such a construction, when the output of inverter IV11 is at the "H" level corresponding to an inactive state of boost control signal BST, voltage generation switch circuit 315 outputs power supply voltage Vcc to internal node N21. When the output of inverter IV11 is at the "L" level corresponding to an activate state of boost control signal BST, however, transistor Q24 turns off, internal node N21 and power supply line 342 are thus disconnected, and the output voltage of boost capacitance switch circuit 314 is transmitted to output transistor 330.

In boost capacitance switch circuit 314, when boost control signal BST is inactive, and the output of inverter IV11 is at the "H" level, the output of inverter IV12 attains the "L" level and transistor Q23 turns on, and therefore boost capacitor Cb1 is charged by a voltage difference between power supply voltage Vcc and the "L" level voltage output from inverter IV12. Further, boost capacitor Cb2 is charged by a voltage difference between power supply voltage Vcc and ground voltage Vss.

When the output of inverter IV11 changes to the "L" level in response to activation of boost control signal BST, charge stored in both boost capacitors Cb1, Cb2 or only charge stored in boost capacitor Cb1 is discharged to internal node N21 according to the voltage level of Vcc level signal LVL. Thus, the voltage level of internal node N21 has a value of the "H" level voltage output from inverter IV12 plus the boosted amount corresponding to the charge stored in one or more boost capacitors.

Vcc level signal LVL is set at the "L" level when power supply voltage Vcc is at most a prescribed level and at the "H" level when power supply voltage Vcc is higher than the prescribed level. When the output of inverter IV11 is at the "L" level according to activation of boost control signal BST, and signal LVL is at the "L" level, the voltage level of node N23 is at the power supply voltage Vcc level since transistors Q21 and Q22 turn on. That is, a value of power supply voltage Vcc plus the boosted voltage ($\Delta Vb1+\Delta Vb2$) by boost capacitors Cb1, Cb2 is output to internal node N21.

When signal LVL is at the "H" level, transistor Q22 turns off. Thus, the voltage of node N23 is ground voltage Vss, and charge stored in boost capacitor Cb2 is not used to boost internal node N21.

According to such a construction, the capacitance of a boost capacitor can be switched equivalently at the power supply voltage Vcc level.

Voltage generation circuit 300 also includes gate boost circuit 320. When a boosted voltage is applied to the source of output transistor 330 by boost circuit 310 according to boost control signal BST, gate boost circuit 320 boosts the gate voltage of output transistor 330 to transmit the boosted voltage to voltage supply node 340.

According to the configuration of voltage generation circuit 300 described with reference to FIG. 8, the problem of excessive boosting of a word line voltage can be solved, even when a power supply voltage is high, by switching, according to the level of power supply voltage Vcc, the boosted amount of boosted voltage Vbst from power supply voltage Vcc when boost control signal BST is activated.

In the configuration of voltage generation circuit 300, however, the level of power supply voltage Vcc has always to be detected by a Vcc level detection circuit. Thus, current is consumed by the Vcc level detection circuit even during a standby period when a boosting operation is not required. Therefore, a standby current increases which in turn increases power consumption by the entire memory device.

SUMMARY OF THE INVENTION

An object of the present invention is to provide a voltage generation circuit capable of solving the problem of excessive boosting of an output voltage, even when a power supply voltage is high, without increasing power consumption, thereby accommodating wide-ranging power supply voltage levels in one circuit.

Another object of the present invention is to provide a semiconductor memory device in which such a voltage generation circuit is used to generate a word line drive voltage.

In summary, the present invention is a voltage generation circuit boosting a power supply voltage and outputting the boosted voltage to a supply node according to a boost control signal, the circuit including a boost circuit and a boost level limitation circuit.

The boost circuit boosts the voltage level of a first node from the power supply voltage in response to activation of the boost control signal. The boost level limitation circuit provided between the first node and the supply node connects the first node and the supply node when the voltage level of the first node is at most a prescribed upper limit voltage, and disconnects the first node and supply node when the voltage level of the first node exceeds the upper limit voltage.

According to another aspect of the present invention, a semiconductor memory device includes a memory cell array, a plurality of word lines, and a word line boost circuit.

The memory cell array has a plurality of storage elements arranged in rows and columns. The plurality of word lines are provided corresponding to the rows of the storage elements. The word line boost circuit receives a word line boost circuit operating voltage, and supplies a word line drive voltage, which is higher than the operating power supply voltage, to at least one of the plurality of word lines, which is selected according to an address signal, when the word line is to be driven.

The word line boost circuit includes a supply node outputting the word line drive voltage according to a boost control signal activated at the time of word line driving, a boost circuit boosting the voltage level of an internal node from the operating power supply voltage in response to activation of the boost control signal, and a boost level limitation circuit provided between the internal node and the supply node, connecting the internal node and the supply node when the voltage level of the internal node is at most a prescribed upper limit voltage, and disconnecting the internal node and the supply node when the voltage level of the internal node exceeds the upper limit voltage.

Therefore, a main advantage of the present invention is that when the voltage level of the supply node exceeds the upper limit voltage, the connection of the first boost circuit and the supply node is disconnected by an output transmission circuit, so that the voltage of the supply node can be controlled not to exceed a prescribed upper limit voltage even when they are used at wide-ranging power supply voltages without increasing power consumption.

Since word lines are driven by the boosted voltage which is output from such a voltage generation circuit, row selection operation can be performed at high speed, and application of an overvoltage to the word lines can be prevented even when they are used at wide-ranging power supply voltages without increasing power consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described in detail with reference to the drawings. In the drawings, the same reference characters denote the same or corresponding parts.

First Embodiment

Figure 1:
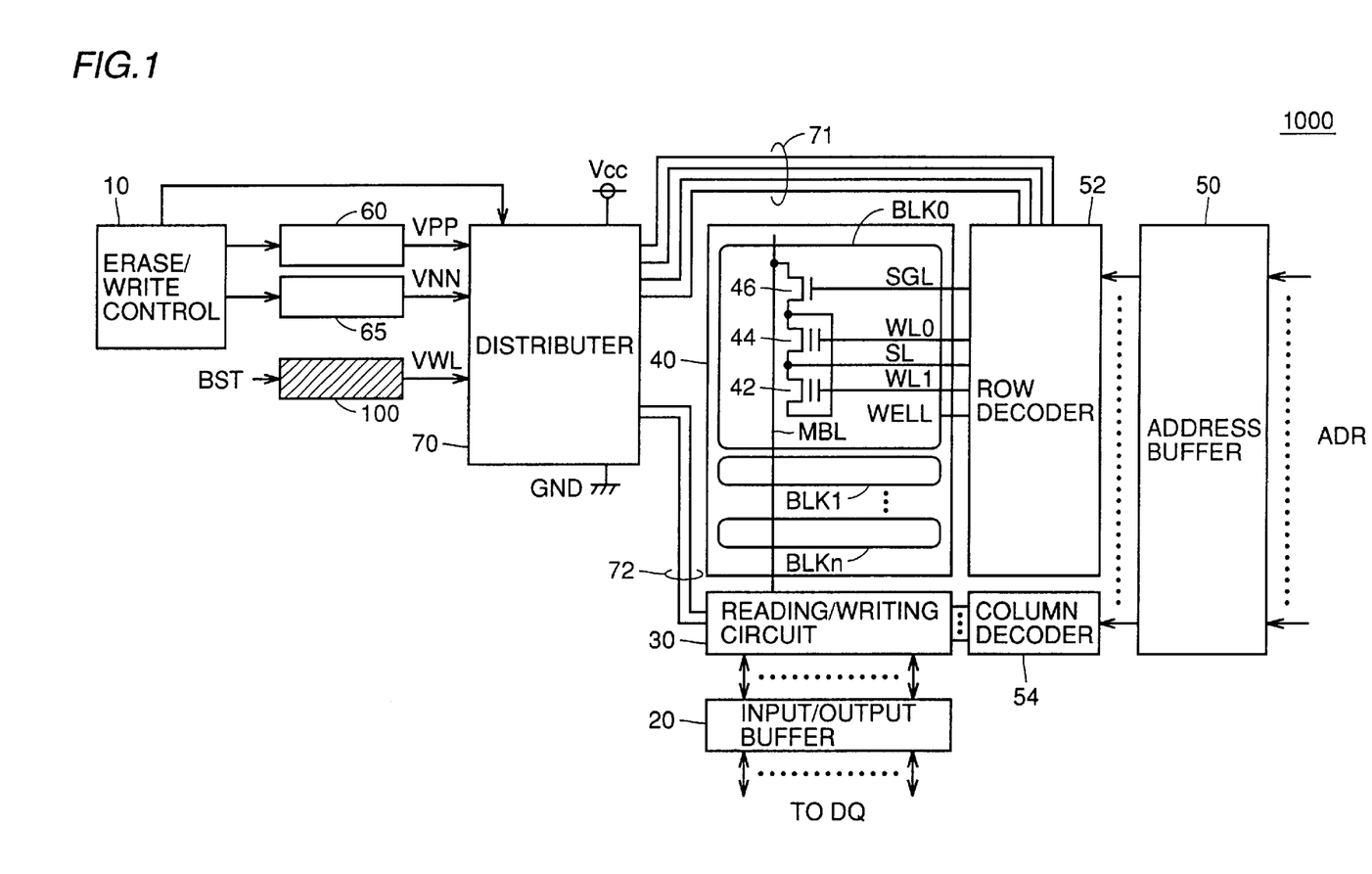
FIG. 1 is a schematic block diagram showing an overall configuration of a semiconductor memory device 1000 including a voltage generation circuit according to the present invention.

FIG. 1 is a schematic block diagram showing an overall configuration of a semiconductor memory device 1000 including a voltage generation circuit according to the present invention.

FIG. 1 shows a flash memory as an example of the semiconductor memory device. For the simplicity of description, the memory cell array in one block is illustrated as the configuration of two rows×one column.

As is apparent from the following description, a semiconductor device to which the voltage generation circuit according to the present invention is applied is not limited to the flash memory. The voltage generation circuit according to the present invention can be extensively applied for the purpose of achieving higher speed operation and prevention of overvoltage application at wide-ranging power supply voltages when storage data is to be read by driving of word lines.

Semiconductor memory device 1000 includes an erase/write control circuit 10 controlling the timing of storage data writing and erasing operations and the voltage for each operation, and a memory cell array 40 having memory cells as storage elements arranged in rows and columns.

Memory cell array 40 includes memory blocks BLK0, BLK1~BLKn (n: natural number) each formed inside a separate well.

Memory block BLK0 includes memory cells 42, 44 and a select gate 46. In memory block BLK0, a memory cell corresponding to a select gate line SGL, word lines WL0, WL1 and a source line SL which are selected by a row decoder 52 is selected, and then a signal corresponding to data is received from a main bit line MBL to hold the data, or read data is transmitted from the memory cell to main bit line MBL.

Semiconductor memory device 1000 further includes an address buffer 50 receiving an address signal ADR for selecting a memory cell in memory cell array 40, row and column decoders 52, 54 selecting a row and a column of memory cells according to the address signal output by address buffer 50, a reading/writing circuit 30 latching read data from memory cell array 40 to be amplified or latching write data transmitted from an input/output buffer 20 to be written to the memory cell array, and an input/output buffer 20 outputting data output from reading/writing circuit 30 to a data terminal or transmitting write data input from the data terminal to reading/writing circuit 30.

In the flash memory, a memory cell is formed of one transistor and the transistor has its drain connected to a bit line and its control gate connected to a word line. Data writing, erasing and reading operations for a memory cell are carried out by setting the voltage levels of memory cell word line WL, select gate SG, a well and main bit line MBL at prescribed voltage levels.

Figure 2:
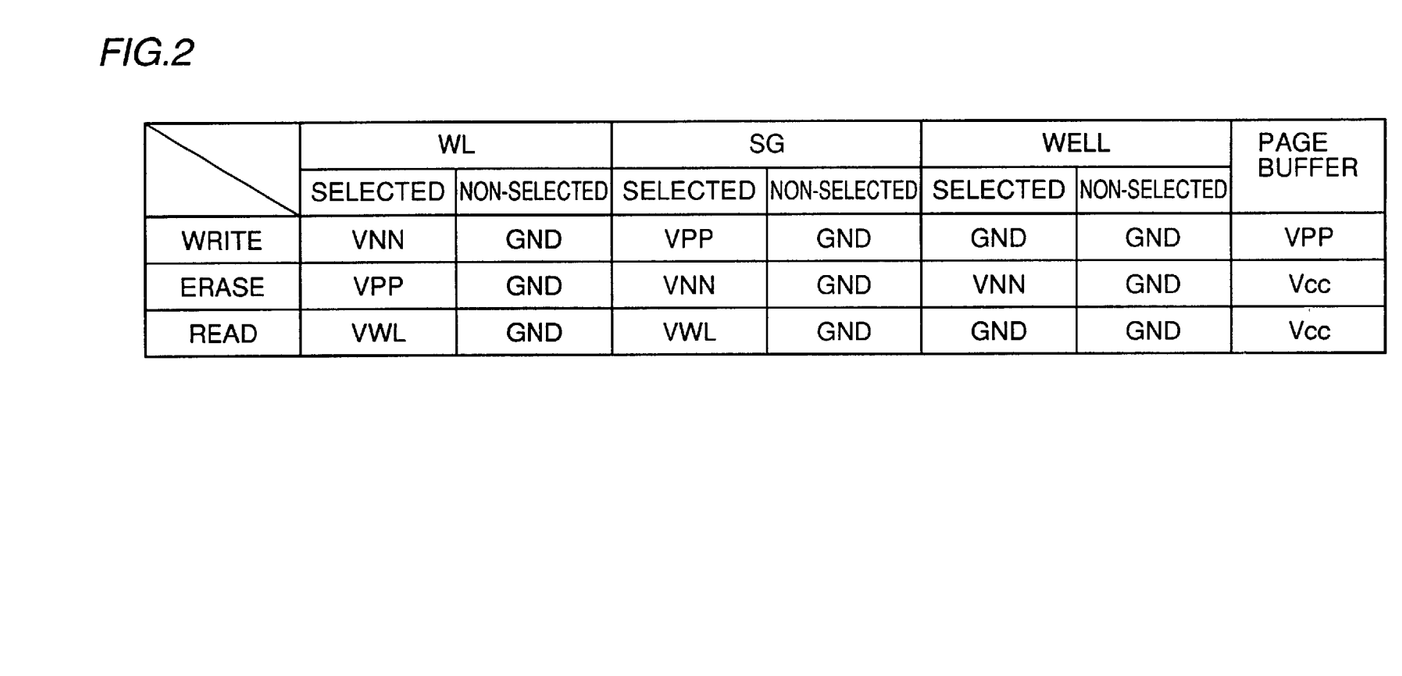
FIG. 2 is a chart for describing the voltage level of each memory cell array portion during data writing, erasing and reading operations.

FIG. 2 is a chart for describing the voltage levels of each memory cell array portion during the data writing, erasing and reading operations.

Referring to FIG. 2, when data is to be written, word line WL selected according to address signal ADR is supplied with a negative high voltage VNN while non-selected word line WL is supplied with a ground voltage GND. Similarly, selected select gate SG is supplied with a positive high voltage VPP while non-selected select gate SG is supplied with ground voltage GND. During the writing operation, the well corresponding to each block is set at ground voltage GND. In a page buffer (not shown) included in reading/writing circuit 30, main bit line MBL is supplied with positive high voltage VPP according to data when the data is to be written to a memory cell.

Data erasing will be described in the following. In erasing data, word line WL selected according to address signal ADR is supplied with positive high voltage VPP while non-selected word line WL is supplied with ground voltage GND. Similarly, selected select gate SG is supplied with negative high voltage VNN while a non-selected select gate is supplied with ground voltage GND. During the erasing operation, the well voltage of a memory block in which data is erased is set at negative high voltage VNN, and the well of a memory block which is not selected for erasing, that is, in which data is not erased is supplied with ground voltage GND.

The data reading operation will be described in the following.

In reading data, word line WL selected according to the address signal is supplied with a boost word line voltage VWL while non-selected word line WL is supplied with ground voltage GND. Similarly, selected select gate SG is supplied with boost word line voltage VWL while a non-selected select gate is supplied with ground voltage GND. During the reading operation, the well of each memory block is set at ground voltage GND. Since data is not written from a page buffer during data reading and data erasing, a voltage supplied to main bit line MBL by the page buffer is power supply voltage Vcc.

Referring again to FIG. 1, semiconductor memory device 1000 further includes a positive voltage generation circuit 60 generating positive high voltage VPP, a negative voltage generation circuit 65 generating negative high voltage VNN, and a word line boost circuit 100 generating boost word line voltage VWL. The voltages are described with respect to FIG. 2.

Positive voltage generation circuit 60 and negative voltage generation circuit 65 are controlled by erase/write control circuit 10, and supply a distributor 70 with voltages VPP and VNN necessary for the writing and erasing operations. Word line boost circuit 100 receives boost control signal BST and transmits boost word line voltage VWL to distributor 70 during a period in which boosting is designated.

Semiconductor memory device 1000 further includes a distributor 70 receiving voltages VPP, VNN and VWL, and transmitting necessary voltage levels to row decoder 52 and reading/writing circuit 30 during the writing, erasing and reading operations, an interconnection 71 transmitting voltages VPP, VNN, VWL and GND from distributor 70 to row decoder 52, and an interconnection 72 transmitting voltages VPP and Vcc from distributor 70 to reading/writing circuit 30.

Each voltage transmitted to row decoder 52 and reading/writing circuit 30 by distributor 70 is applied to word line WL, select gate SG, well WELL and the page buffer as necessary during their operation.

In the present invention, a voltage generation circuit configuration in which boost word line voltage VWL is not excessively boosted, even when Vcc is high, according to power supply voltage Vcc which is set in a wide range is described with respect to word line boost circuit 100.

Figure 3:
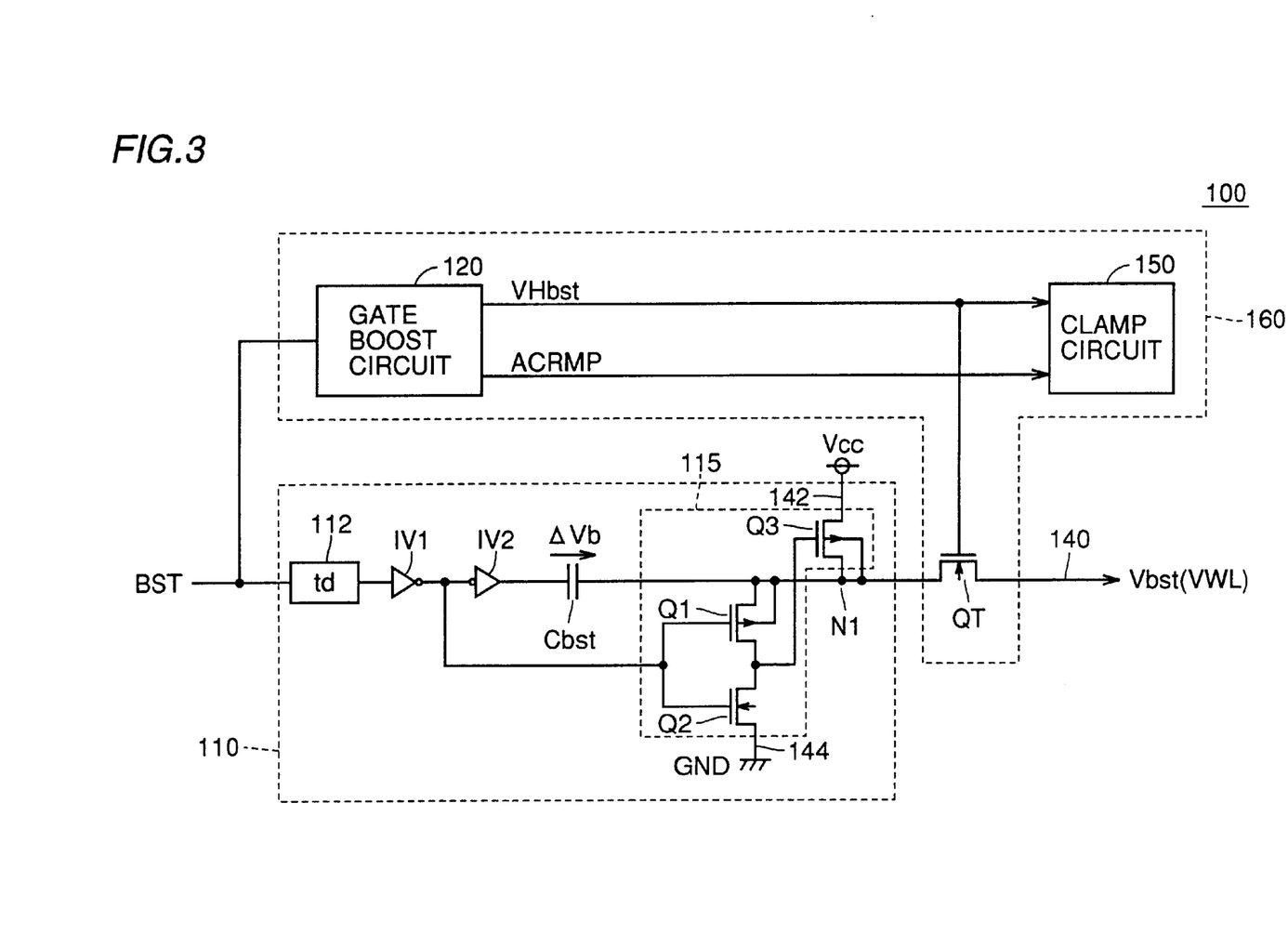
FIG. 3 is a circuit diagram for describing an overall configuration of voltage generation circuit 100.

FIG. 3 is a circuit diagram showing an overall configuration of voltage generation circuit 100 applied as a word line boost circuit.

Referring to FIG. 3, voltage generation circuit 100 includes a boost circuit 110 transmitting to an output transistor QT one of power supply voltage Vcc and a boosted voltage obtained by boosting Vcc, according to boost control signal BST for designating activation of the boosting operation of the word line boost circuit, a voltage supply node 140 generating a boost word line voltage VWL, and a boost level limitation circuit 160 controlling the voltage level of voltage supply node 140 not to exceed a prescribed upper limit voltage.

The voltage level Vbst of voltage supply node 140 attains that of boost word line voltage VWL and is transmitted to distributor 70 when the boosting operation is designated.

Boost level limitation circuit 160 includes a gate boost circuit 120 boosting gate voltage VHbst of output transistor QT in response to activation of boost control signal BST, a clamp circuit 150 clamping gate voltage VHbst to a prescribed voltage, and an output transistor QT receiving voltage VHbst at its gate and connecting boost circuit 110 and voltage supply node 140.

Boost control signal BST is a signal activated (to the "H" level) when boosting is necessary and otherwise inactivated (to the "L" level).

Boost circuit 110 includes a delay circuit 112 outputting boost control signal BST with a delay of prescribed time td, an inverter IV1 inverting and outputting an output of delay circuit 112, an inverter IV2 inverting the output of inverter IV1, a boost capacitor Cbst connected between the output node of inverter IV2 and an internal node N1, and a voltage switch circuit 115 selectively outputting one of power supply voltage Vcc and the boosted voltage provided by adding the boosted voltage amount by boost capacitor Cbst to Vcc as the output signal of inverter IV1.

Voltage switch circuit 115 has a P type MOS transistor Q1 and an N type MOS transistor Q2 connected in series between node N1 and a ground line 144. The gates of transistors Q1 and Q2 are supplied with the output signal of inverter IV1.

Voltage switch circuit 115 also has a P type MOS transistor Q3 provided to connect a power supply line 142 and internal node N1 and having its gate connected to the drains of transistors Q1 and Q2.

When the output of inverter IV1 is at the "H" level corresponding to the inactive state of boost control signal BST, transistors Q2 and Q3 turn on and the voltage of node N1 is set at the Vcc level. Simultaneously, boost capacitor Cbst is charged by a voltage difference between power supply voltage Vcc and the voltage level of the "L" level of the output signal of inverter IV2. Then, boost control signal BST is activated. When the output of inverter IV1 attains the "L" level in response, transistors Q2 and Q3 turn off and transistor Q1 turns on.

Thus, internal node N1 is disconnected from power supply line 142, and it is set at a voltage level corresponding to the sum of the voltage level of the "H" level of the output signal of inverter IV2 and a voltage ΔVb stored in boost capacitor Cbst.

Voltage generation circuit 100 further includes a gate boost circuit 120 setting gate voltage VHbst of output transistor QT at the level of boosted Vcc when boost control signal BST is active, and setting voltage VHbst at power supply voltage Vcc when boost control signal BST is inactive.

When the boosting operation is activated according to boost control signal BST, gate boost circuit 120 generates a control signal ACRMP for designating activation of clamp circuit 150.

Figure 4:
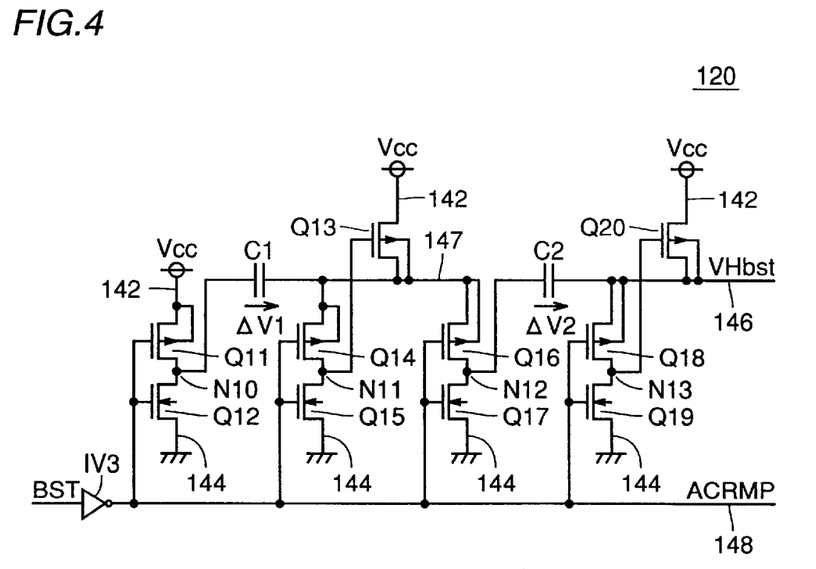
FIG. 4 is a circuit diagram showing a configuration of gate boost circuit 120.

FIG. 4 is a circuit diagram showing a configuration of gate boost circuit 120.

Referring to FIG. 4, gate boost circuit 120 has an inverter IV3 receiving boost control signal BST at its input, and an interconnection 148 transmitting an output of inverter IV3. Gate boost circuit 120 also has a P type MOS transistor Q11 provided to connect power supply line 142 and a node N10, and an N type MOS transistor Q12 connected between node N10 and ground line 144. The gates of transistors Q11 and Q12 are connected to interconnection 148.

Gate boost circuit 120 also has a boost capacitor C1 connected between an interconnection 147 and node N10, a P type MOS transistor Q14 provided to connect interconnection 147 and a node N11, and an N type MOS transistor Q15 provided between node N11 and ground line 144. The gates of transistors Q14 and Q15 are connected to interconnection 148.

Gate boost circuit 120 also has a P type MOS transistor Q13 connected between power supply line 142 and interconnection 147 and having its gate connected to node N11, a P type MOS transistor Q16 provided to connect interconnection 147 and a node N12, and an N type MOS transistor Q17 provided to connect node N12 and ground line 144.

Gate boost circuit 120 also has a boost capacitor C2 connected between node N12 and an interconnection 146 for transmitting gate boost voltage VHbst, a P type MOS transistor Q18 connected between interconnection 146 and a node N13, an N type MOS transistor Q19 connected between node N13 and ground line 144, and a P type MOS transistor Q20 having its gate connected to node N13 and connecting power supply line 142 and interconnection 146. The gates of transistors Q16, Q17, Q18 and Q19 are connected to interconnection 148.

According to such a construction, the voltage level of interconnection 148 attains the "L" level when boost control signal BST is activated (to the "H" level), and it is at the "H" level when boost control signal BST is inactive.

When boost control signal BST is inactive, transistors Q12, Q13, Q15, Q17, Q19 and Q20 turn on, the voltage levels of nodes N10, N11, N12 and N13 are set at the ground voltage GND level, and interconnections 146 and 147 are set at the power supply voltage Vcc level. At the same time, boost capacitors C1 and C2 are supplied with a voltage difference of (power supply voltage Vcc–ground voltage GND) and charged accordingly.

When boost control signal BST is activated (to the "H" level), the voltage level of interconnection 148 attains the "L" level. Thus, transistors Q12, Q13, Q15, Q17, Q19, Q20 which have been on so far turn off, and transistors Q11, Q14, Q16, Q18 turn on. Therefore, the voltage level of interconnection 147 is set at Vcc+ΔV1 (ΔV1: boosted amount by boost capacitor C1), and the voltage level of interconnection 146, that is, VHbst is set at Vcc+ΔV1+ΔV2 (ΔV2: boosted amount by boost capacitor C2). When boost control signal BST is activated, the boosted voltage level of Vcc+ΔV1+ΔV2 is applied to the gate of output transistor QT.

Figure 5:
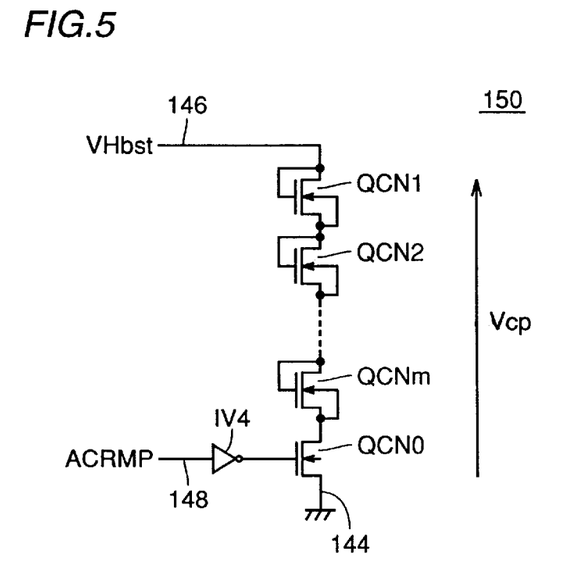
FIG. 5 is a circuit diagram showing a configuration of clamp circuit 150.

FIG. 5 is a circuit diagram showing a configuration of clamp circuit 150.

Referring to FIG. 5, clamp circuit 150 has N type transistors QCN1~QCNm (m: natural number) connected between interconnection 146 transmitting voltage VHbst and ground line 144, and a current control transistor QCN0.

Clamp circuit 150 further includes an inverter IV4 having its input node connected to interconnection 148 and its output node connected to the gate of transistor QCN0. Since a clamp circuit activation signal ACRMP applied from interconnection 148 corresponds to an inverted signal of boost control signal BST, the output of inverter IV4 is at the "H" level when boost control signal BST is active. Thus, current control transistor QCN0 turns on and transistors QCN1~QCNm are supplied with current.

When boost control signal BST is inactive, current control transistor QCN is off and transistors QCN1~QCNm are not supplied with current. Thus, clamp circuit 150 is inactive.

While the boosting operation is not necessary, therefore, current flow in the clamp circuit can be cut off and power consumption can be reduced.

Transistors QCN1~QCNm are diode-connected and provided to flow current in the direction from interconnection 146 to ground line 144. In other words, each transistor has its source connected to its gate and similarly its drain connected to the region immediately under its gate. Clamp voltage Vcp can be arbitrarily set according to selection of the number m of transistor stages and the transistor sizes.

According to such a construction, when the boost control signal is activated, the voltage level of interconnection 146 can be reduced to the clamp voltage by the discharge path formed in clamp circuit 150.

Figure 6:
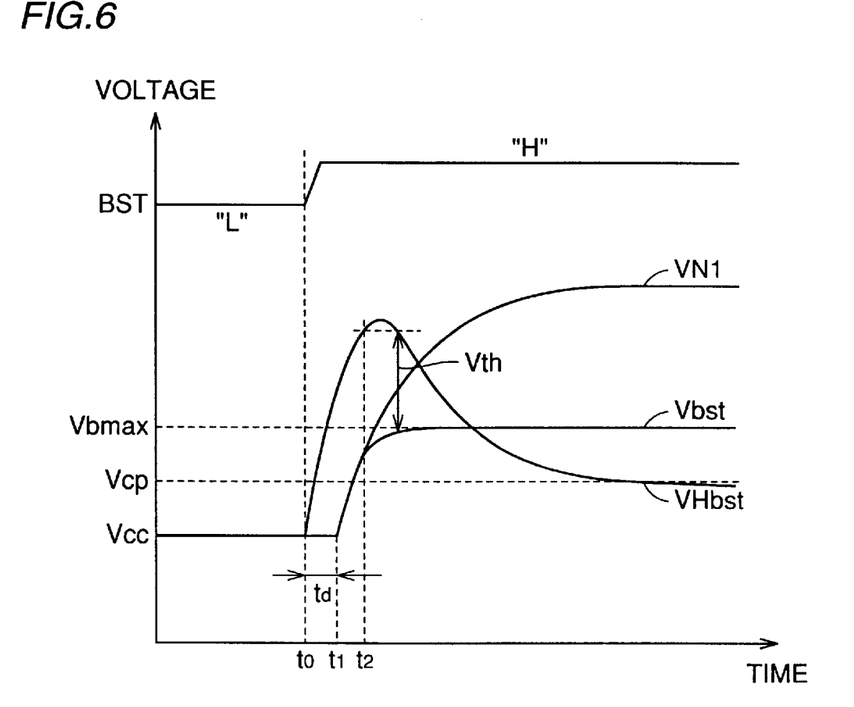
FIG. 6 is a waveform chart showing a voltage level change in each portion of voltage generation circuit 100.

FIG. 6 is a waveform chart showing a voltage level change in each portion of voltage generation circuit 100.

Referring to FIG. 6, at time t0, boost control signal BST is activated and raised from the "L" level to the "H" level. In response, voltage VHbst is boosted by charge stored in boost capacitors C1 and C2 in gate boost circuit 120 described with reference to FIG. 4.

Meanwhile, at time t1 which is later than time t0 by delay time td, that is set in delay circuit 112, the voltage level of the output signal of inverter IV1 is inverted and therefore voltage VN1 of node N1 begins to increase because of charge stored in boost capacitor Cbst.

Since gate voltage VHbst of output transistor QT has been boosted prior to boosting of voltage VN1, the voltage boosting at node N1 is transmitted to voltage supply node 142 through output transistor QT.

However, clamp circuit 150 is activated in response to activation of boost control signal BST as described with respect to FIG. 5. Therefore, the voltage level of interconnection 146, that is, VHbst, exceeds the clamp voltage Vcp level and rises in an overshoot manner in the beginning, begins to decrease after the peak at certain time, and attains VHbst–Vbst<Vth (Vth: threshold voltage of output transistor QT) where output transistor QT turns off. Since output transistor QT maintains its off state thereafter, boosted voltage Vbst output to the voltage supply node maintains a constant voltage unless current leakage is caused. That is, occurrence of an excessive boosted voltage at the voltage supply node can be prevented.

Thereafter, gate boost voltage VHbst decreases to the level of clamp voltage Vcp.

The upper limit value of voltage Vbst generated at voltage supply node 140 is determined by a change in the gate voltage of output transistor QT, which is an output of gate boost circuit 120.

The clamping capability of clamp circuit 150 is determined by the stage number m of diode-connected transistors provided in clamp circuit 150 and the size of each transistor. When the clamping capability is higher, the time necessary for voltage VHbst to reach clamp voltage Vcp is shorter. The value of delay time td applied by delay circuit 112 also greatly influences setting of the upper limit value of output voltage Vbst.

Therefore, by setting the stage number and size of transistors in clamp circuit 150 and delay time td by delay circuit 112 in an optimum manner while considering transitional voltage changes, the problem of excessive boosting of voltage supply node voltage Vbst at wide-ranging power supply voltages can be solved even when transitional voltage supply, that is, supply of a word line drive voltage, for example, is required.

In voltage generation circuit 100, the amount of boosting from power supply voltage Vcc is not limited as in a conventional voltage generation circuit, and transmission of a boosted voltage given by the sum of power supply voltage Vcc and the boosted amount is cut off by an output transistor. Therefore, application of an overvoltage to a voltage supply node can be prevented more reliably, and the range of applicable power supply voltage levels can be made larger.

Second Embodiment

In a second embodiment, another configuration of the clamp circuit will be described.

Figure 7:
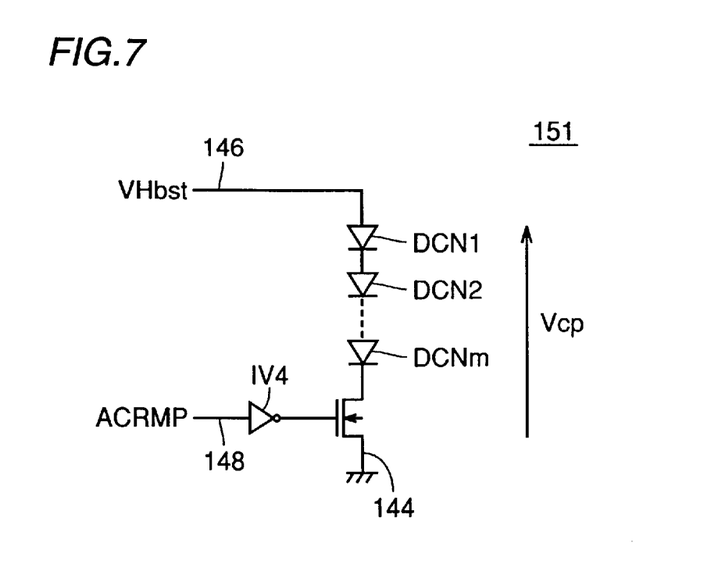
FIG. 7 is a circuit diagram showing a configuration of clamp circuit 151 in a second embodiment.

FIG. 7 is a circuit diagram showing a configuration of a clamp circuit 151 in the second embodiment. Referring to FIG. 7, clamp circuit 151 is different from clamp circuit 150 in the first embodiment in that clamp circuit 151 has serially connected m diodes DCP1~DCPm instead of serially connected transistors QCN1~QCNm. Since other configuration and operation are the same as those of clamp circuit 150, description thereof will not be repeated.

Clamp circuit 151 is a circuit for clamping the voltage level of interconnection 146, that is, VHbst to clamp voltage Vcp by using PN diodes. However, clamp circuit 151 is characterized in that it is less influenced by a change in the manufacturing process compared with diode-connected MOS transistors shown in clamp circuit 150.

In other words, in diode-connected MOS transistors, the amount of voltage drop in each transistor during the clamping operation is determined by the threshold voltage of the transistor. In PN junction diodes, however, the amount of voltage drop in the forward direction is determined by the diffusion voltage of the PN junction. The diffusion voltage of the PN junction is generally more stable than the threshold voltage of the MOS transistor. Therefore, by the use of the construction of clamp circuit 151, a voltage generation circuit in which the upper limit value controllability of an output voltage is less influenced by a change in the manufacturing process can be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generation circuit boosting a power supply voltage and outputting the voltage to a supply node according to a boost control signal, comprising:
   a first boost circuit boosting a voltage level of a first node from said power supply voltage in response to activation of said boost control signal; and
   a boost level limitation circuit provided between said first node and said supply node, connecting said first node and said supply node when the voltage level of said supply node is at most a prescribed upper limit voltage, and disconnecting said first node and said supply node when the voltage level of said supply node exceeds said upper limit voltage.

2. The voltage generation circuit according to claim 1, wherein
   said boost level limitation circuit includes
   a second boost circuit boosting a voltage level of a second node from said power supply voltage in response to activation of said boost control signal,
   a voltage clamp circuit operating in response to activation of said boost control signal and reducing the voltage level of said second node to a prescribed clamp voltage when the voltage level of said second node is higher than said clamp voltage, and
   a transmission transistor having its gate connected to said second node and electrically connected between said first node and said supply node.

3. The voltage generation circuit according to claim 2, wherein
   said voltage clamp circuit has at least one clamp transistor connected in series between said second node and a voltage lower than said clamp voltage,
   said clamp transistor is diode-connected to flow current from said second node toward said voltage lower than the clamp voltage,
   said voltage clamp circuit further has a clamp activation switch connected in series with said clamp transistor, and
   said clamp activation switch turns on in response to activation of said boost control signal.

4. The voltage generation circuit according to claim 2, wherein
   said voltage clamp circuit has at least one clamp diode connected in series between said second node and a voltage lower than said clamp voltage,
   said clamp diode is provided to flow current from said second node toward said voltage lower than the clamp voltage,
   said voltage clamp circuit further has a clamp activation switch connected in series with said clamp diode, and
   said clamp activation switch turns on in response to activation of said boost control signal.

5. The voltage generation circuit according to claim 2, wherein
   said first boost circuit includes a signal delay circuit delaying said boost control signal by prescribed time, and boosts the voltage level of said first node based on an output of said signal delay circuit.

6. The voltage generation circuit according to claim 5, wherein
   said boost control signal has two voltage levels of a first voltage level lower than said power supply voltage and a second voltage level higher than said first voltage, and
   said first boost circuit includes:
   a boost capacitor connected between said signal delay circuit and said first node, and
   a switch circuit connecting said power supply voltage and said first node when the voltage level of said boost control signal is said first voltage level, and disconnecting said power supply voltage and said first node when the voltage level of said boost control signal becomes said second voltage level.

7. The voltage generation circuit according to claim 5, wherein
   said boost control circuit signal has two voltage levels of a first voltage level lower than said power supply voltage and a second voltage level higher than said first voltage, and
   said second boost circuit includes:
   a boost capacitor having a pair of opposing electrodes, one electrode of said pair of electrodes electrically connected to said second node,
   a first switch circuit connecting the other electrode of said pair of electrodes and a voltage lower than said power supply voltage when the voltage level of said boost control signal is said first voltage level, and connecting said other electrode of said pair of electrodes and said power supply voltage when the voltage level of said boost control signal is said second voltage level, and
   a second switch circuit connecting said power supply voltage and said second node when the voltage level of said boost control signal is said first voltage level, and disconnecting said power supply voltage and said second node when the voltage level of said boost control signal is said second voltage level.

8. The voltage generation circuit according to claim 2, wherein
   a boosted amount of a maximum voltage, which said second boost circuit can output to said second node, from said power supply voltage is larger than a boosted amount of a maximum voltage, which said first boost circuit can output to said first node, from said power supply voltage.

9. A semiconductor memory device, comprising:
   a memory cell array having a plurality of storage elements arranged in rows and columns;
   a plurality of word lines provided corresponding to rows of said storage elements; and
   a word line boost circuit receiving an operating power supply voltage, and supplying at least one of said plurality of word lines selected according to an address signal with a word line device voltage higher than said operating power supply voltage at time of word line driving,
   said word line boost circuit including
   a supply node outputting said word line drive voltage according to a boost control signal activated at the time of word line driving,
   a first boost circuit boosting a voltage level of a first node from said operating power supply voltage in response to activation of said boost control signal, and a boost level limitation circuit provided between said first node and said supply node, connecting said first node and said supply node when the voltage level of said supply node is at most a prescribed upper limit voltage, and disconnecting said first node and said supply node when the voltage level of said supply node exceeds said upper limit voltage.

10. The semiconductor memory device according to claim 9, wherein said boost level limitation circuit has a second boost circuit boosting a voltage level of a second node from said power supply voltage in response to activation of said boost control signal, a voltage clamp circuit operating in response to activation of said boost control signal and reducing the voltage level of said second node to a prescribed clamp voltage when the voltage level of said second node is higher than said clamp voltage, and a transmission transistor having its gate connected to said second node and electrically connected between said first node and said supply node.

11. The semiconductor memory device according to claim 9 wherein, said semiconductor memory device is a flash memory.

* * * * *